(12) United States Patent
Cho et al.

(10) Patent No.: US 12,057,184 B2
(45) Date of Patent: Aug. 6, 2024

(54) MEMORY SYSTEMS HAVING MEMORY DEVICES THEREIN WITH ENHANCED ERROR CORRECTION CAPABILITY AND METHODS OF OPERATING SAME

(71) Applicant: SAMSUNG ELECTRONICS CO., LTD., Suwon-si (KR)

(72) Inventors: Sunghye Cho, Hwaseong-si (KR); Kiheung Kim, Suwon-si (KR); Sungrae Kim, Seoul (KR); Junhyung Kim, Suwon-si (KR); Kijun Lee, Seoul (KR); Myungkyu Lee, Seoul (KR); Changyong Lee, Hwaseong-si (KR); Sanguhn Cha, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/164,100

(22) Filed: Feb. 3, 2023

(65) Prior Publication Data

US 2023/0178168 A1   Jun. 8, 2023

Related U.S. Application Data

(63) Continuation of application No. 17/461,380, filed on Aug. 30, 2021, now Pat. No. 11,605,441.

(51) Int. Cl.
*G11C 29/42* (2006.01)
*G11C 11/408* (2006.01)
*G11C 11/4091* (2006.01)
*G11C 29/44* (2006.01)
*G11C 29/12* (2006.01)

(52) U.S. Cl.
CPC .......... *G11C 29/42* (2013.01); *G11C 11/4087* (2013.01); *G11C 11/4091* (2013.01); *G11C 29/4401* (2013.01); *G11C 2029/1202* (2013.01); *G11C 2029/1204* (2013.01)

(58) Field of Classification Search
CPC ................ G11C 29/42; G11C 29/4401; G11C 2029/1202; G11C 2029/1204; G11C 11/4087; G11C 11/4091
See application file for complete search history.

(56) References Cited

U.S. PATENT DOCUMENTS

| | | | |
|---|---|---|---|
| 7,096,406 B2 | 8/2006 | Kanazawa et al. | |
| 9,053,813 B2 | 6/2015 | Kang et al. | |
| 9,830,218 B2 * | 11/2017 | Han | ............ G06F 12/0895 |
| 9,886,340 B2 | 2/2018 | Ahn et al. | |

(Continued)

FOREIGN PATENT DOCUMENTS

| KR | 20080022630 A | 3/2008 |
|---|---|---|
| KR | 20210092391 A | 7/2021 |

*Primary Examiner* — Son L Mai
(74) *Attorney, Agent, or Firm* — Myers Bigel, P.A.

(57) ABSTRACT

A memory system includes a memory module having a plurality of memory devices therein. A memory controller is configured to transmit commands and addresses to the memory module in synchronization with a clock, input/output data to and from the memory module in synchronization with a data transfer clock, and perform system error correction operations on data read from the memory module. The plurality of memory devices perform on-die error correction operations, which are different from each other according to a physical location of the stored read data.

20 Claims, 26 Drawing Sheets

(56) References Cited

U.S. PATENT DOCUMENTS

| | | |
|---|---|---|
| 10,037,244 B2 | 7/2018 | Chung et al. |
| 10,108,512 B2 | 10/2018 | Halbert et al. |
| 10,521,294 B2 | 12/2019 | Bacchus |
| 10,922,171 B2 | 2/2021 | Cho et al. |
| 10,929,223 B2 | 2/2021 | Oh et al. |
| 10,991,445 B2 | 4/2021 | Mittal et al. |
| 2008/0235557 A1 | 9/2008 | Kim |
| 2019/0140668 A1 | 5/2019 | Kim et al. |
| 2020/0401476 A1 | 12/2020 | Cha et al. |
| 2021/0224156 A1 | 7/2021 | Cho et al. |

* cited by examiner

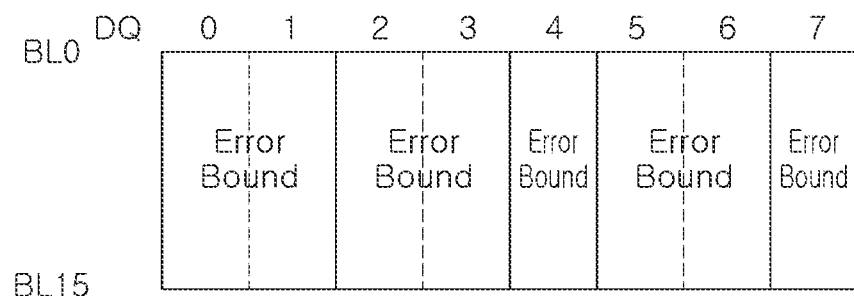
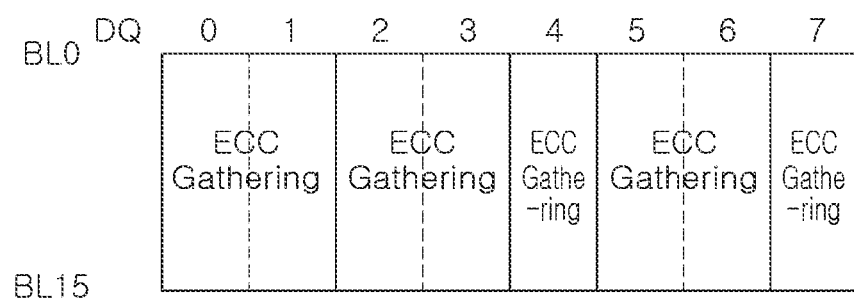
FIG. 8A

| DQ | 0 | 1 | 2 | 3 | 4 | 5 | 6 | 7 |
|---|---|---|---|---|---|---|---|---|
| BL0 | Error Bound | | Error Bound | | Error Bound | Error Bound | | Error Bound |

BL15

| DQ | 0 | 1 | 2 | 3 | 4 | 5 | 6 | 7 |
|---|---|---|---|---|---|---|---|---|
| BL0 | ECC Gathe-ring | | ECC Gathering | | ECC Gathe-ring | ECC Gathering | | ECC Gathering |

Adjacent 2-Bit Correction

FIG. 10B

```
┌─────────────────────────────────┐
│     Perform read operation      │──S210
└─────────────────────────────────┘
                 │
                 ▼
┌─────────────────────────────────┐
│ Determine whether to interleave data │──S220
└─────────────────────────────────┘
                 │
                 ▼
┌─────────────────────────────────┐
│    Perform OD-ECC operation     │──S230
└─────────────────────────────────┘
```

FIG. 16

|  | Adjacent 2-Bit Error | Bounded Fault |
|---|---|---|
| SEC Code | Non-correction | Satisfied |
| Prior S2EC Code | Correction | Partially Satisfied |
| Present S2EC Code | Correction | Satisfied |

FIG. 17

MEMORY SYSTEMS HAVING MEMORY DEVICES THEREIN WITH ENHANCED ERROR CORRECTION CAPABILITY AND METHODS OF OPERATING SAME

The present application is a continuation of and claims priority to U.S. patent application Ser. No. 17/461,380, filed Aug. 30, 2021, the entire content of which is incorporated herein by reference as if set forth in entirety.

BACKGROUND

The present inventive concept relates to a memory device, a memory system having the same, and an operating method thereof.

In general, a semiconductor memory device may be classified as a non-volatile memory device, such as a NAND flash memory device, or a volatile memory device, such as a dynamic random access memory (DRAM). As process scale thereof is reduced, a bit-error-rate of the memory device may be rapidly increased. An error correction code (ECC) circuit may correct such errors. Recently, the need for a memory device to internally perform an ECC operation independently of a host is increasing.

SUMMARY

An aspect of the present inventive concept is to provide a novel on-chip error correctable memory device, a memory system including the same, and an operating method thereof.

According to an aspect of the present inventive concept, a memory device can include a memory module having a plurality of memory devices therein. A memory controller is also provided, which is configured to: (i) transmit commands and addresses to the memory module in synchronization with a clock, (ii) input/output data to and from the memory module in synchronization with a data transfer clock, and (iii) perform a system error correction operation on data read from the memory module. According to these aspects, the plurality of memory devices perform on-die error correction operations, which differ from each other according to a physical location of data being read from the memory devices and/or data being written into the memory devices.

According to another aspect of the present inventive concept, a memory system includes a memory module having a plurality of memory devices, and a memory controller, which is configured to: (i) transmit commands and addresses to the memory module in synchronization with a clock, (ii) input/output data to and from the memory module in synchronization with a data transfer clock, and (iii) perform a system error correction operation on data read from the memory module. Moreover, the plurality of memory devices perform on-die error correction operations, which different from each other according to the physical read/write data location.

According to another aspect of the present inventive concept, a method of operating a memory device includes: (i) receiving a command and an address, (ii) reading data in response to the command and the address, and (iii) correcting at least one error in the read data. This correcting at least one error operation includes: (i) correcting a single bit error in the read data, and (ii) correcting multi-bit errors in the read data using different manners according to the physical read/write data location.

According to another aspect of the present inventive concept, a method of operating a memory system includes: (i) transmitting a read request to a memory module, (ii) receiving a code word corresponding to the read request from the memory module, and (iii) performing a second error correction operation on the code word. This code word includes data respectively output from a plurality of memory devices of the memory module, and the data is generated using first error correction operations, which are different from each other according to the physical location.

BRIEF DESCRIPTION OF DRAWINGS

The above and other aspects, features, and advantages of the present inventive concept will be more clearly understood from the following detailed description, taken in conjunction with the accompanying drawings, in which:

FIG. 8A is a diagram illustrating ECC bound and ECC gathering for odd wordlines of a memory device according to an embodiment of the present inventive concept, and FIG. 8B is a diagram illustrating ECC bound and ECC gathering for even wordlines of a memory device according to an embodiment of the present inventive concept.

FIGS. 10A and 10B are diagrams illustrating an error bound region and an error gathering region for an even wordline of a top bank of a memory device according to an embodiment of the present inventive concept.

FIG. 16 is a flowchart illustrating a method of operating a memory device according to another embodiment of the present inventive concept.

FIG. 17 is a diagram illustrating performance of an error correction code according to an embodiment of the present inventive concept.

DETAILED DESCRIPTION

In the following, the contents of the present inventive concept will be described clearly and in detail to the extent that those of ordinary skill in the technical field of the present inventive concept may easily implement it using the drawings.

A memory device, a memory system having the same, and an operating method thereof, according to an embodiment of the present inventive concept, may perform different on-die error correction codes (OD-ECC) according to a physical location, to improve data reliability.

Figure 1:
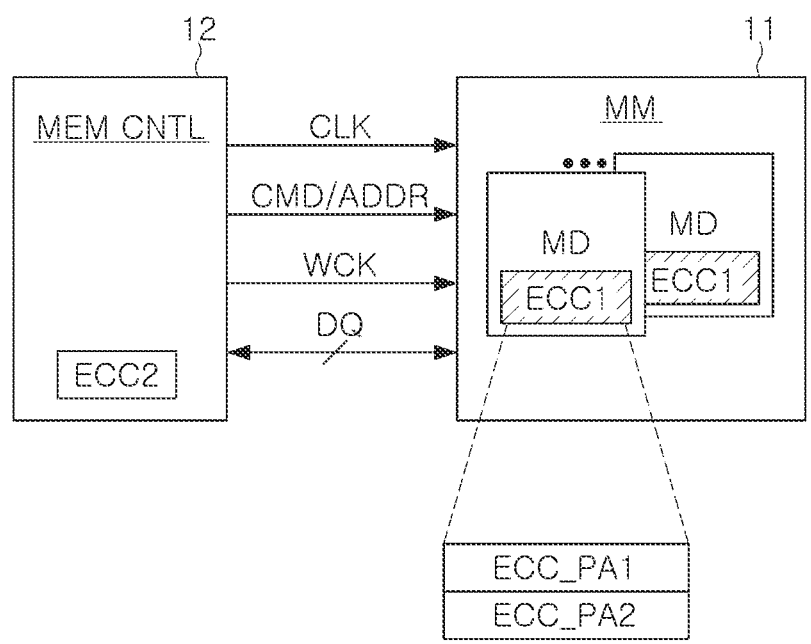
FIG. 1 is a diagram illustrating a memory system according to an embodiment of the present inventive concept.

FIG. 1 is a diagram illustrating a memory system according to an embodiment of the present inventive concept. Referring to FIG. 1, a memory system 10 may include a memory module 11 (MM) and a memory controller 12 (MEM CNTL). The memory system 10 may be implemented to be included in a personal computer or a mobile electronic device. The mobile electronic device may be implemented as a laptop computer, a mobile phone, a smartphone, a tablet PC, a personal digital assistant (PDA), an enterprise digital assistant (EDA), a digital still camera, a digital video camera, a portable multimedia player (PMP), a personal navigation device or a portable navigation device (PND), a handheld game console, a mobile internet device (MID), a wearable computer, an internet-of-things (IoT) device, an internet-of-everything (IoE) device, or a drone.

The memory modules 11 (MM) may include a plurality of memory devices MD. In an embodiment, the memory device MD may be implemented as a volatile memory device. The volatile memory device may be implemented as a random access memory (RAM), a dynamic RAM (DRAM), a static RAM (SRAM), or a low power double data rate (LPDDR) DRAM. In an embodiment, the memory device MD may be implemented as a nonvolatile memory device. Illustratively, the memory device MD may include an electrically erasable programmable read-only memory (EEPROM), a flash memory, an MRAM, an STT-MRAM, a ferroelectric RAM (FeRAM), a phase change RAM (PRAM), a resistive memory (e.g., a resistive RAM (RRAM)), a nanotube RRAM, a polymer RAM (PoRAM), a nano floating gate memory (NFGM), a holographic memory, a molecular electronic memory device, or an insulator resistance change memory.

The memory device MD may include a first error correction circuit ECC1 internally correcting a data error. The first error correction circuit ECC1 may include first and second error correction units ECC1_PA1 and ECC1_PA2, performing error correction using different manners (hardware, software, or firmware) according to a physical location (or an address). For example, when positions in which a non-single bit (NSB) error occurs in data are different for each fault according to a physical location in the memory device MD, the memory device MD may generate an OD-ECC, that is, an error may be corrected by the first error correction circuit ECC1 of the memory device 11, or miscorrection of the OD-ECC may occur in a correctable region by a second error correction circuit ECC2 (e.g., a system ECC) of the memory controller 12.

The first error correction circuit ECC1 may be implemented to correct an error in the memory device MD. The first error correction circuit ECC1 may include a first error correction unit ECC1_PA1 and a second error correction unit ECC1_PA2, receiving a physical location (e.g., a row address, a bank address, or the like), and then performing encoding/decoding the same. The first error correction unit ECC1_PA1 and the second error correction unit ECC1_PA2 may have a correctable error pattern according to the physical location, respectively. In addition, in each of the first error correction unit ECC1_PA1 and the second error correction unit ECC1_PA2, different miscorrection (i.e., improper correction) may occur, when an error(s) exceeding correction capability occurs according to the physical location. For example, in one embodiment, each of the first error correction unit ECC1_PA1 and the second error correction unit ECC1_PA2 may operate by different H-matrices. In this case, the H-matrices may be used to generate an error syndrome, for example, an error vector, by multiplication with a code word.

The memory controller 12 (MEM CNTL) may be implemented as an integrated circuit, a system-on-chip (SoC), an application processor (AP), a mobile AP, a chipset, or a set of chips. The memory controller 12 may include a random access memory (RAM), a central processing unit (CPU), a graphics processing unit (GPU), a neural processing unit (NPU), or a modem. In an embodiment, the memory controller 12 may perform a function of a modem and a function of an AP.

The memory controller 12 may be implemented to control the memory module 11 to read data stored in the memory module 11 or write data to the memory module 11. The memory controller 12 may control a write operation or a read operation on the memory module 11 by providing a command CMD and an address ADDR to the memory module 11 in synchronization with a clock CLK. Also, data DQ may be transmitted/received between the memory controller 12 and the memory module 11 in synchronization with a data transmission clock WCK. Also, the memory controller 12 may include a second error correction circuit ECC2 correcting an error in data DQ transmitted and received with the memory module MM.

A general memory device may receive a row address from an OD-ECC decoder to correct adjacent 2-bit errors, when the adjacent 2-bit errors in odd wordlines and even wordlines are differently generated. However, when an error in column selection line (CSL)/sub wordline (SWL)/sub wordline driver (SWD) occurs, a general memory system may not be able to correct the error due to a miscorrection of the OD-ECC (i.e., may not be able to correct an error occurring during an attempt to correct).

The memory device MD of the present inventive concept may include a first error correction unit ECC_PA1 for odd wordlines and a second error correction unit ECC_PA2 for even wordlines, such that, even when errors in CSL/SWL/SWD occur at the same time, the memory system 10 may correct the errors while performing adjacent 2-bit error correction of odd/even wordlines in an OD-ECC.

The memory system 10 according to an embodiment of the present inventive concept may include different error correction units ECC_PA1 and ECC_PA2 to have the same error correction capability for each physical location of the memory device MD, such that an OD-ECC may be performed according to error characteristics of the physical location of the memory device MD. Therefore, the memory system 10 according to an embodiment of the present inventive concept may improve data error correction capability and improve overall system performance.

Figure 2:
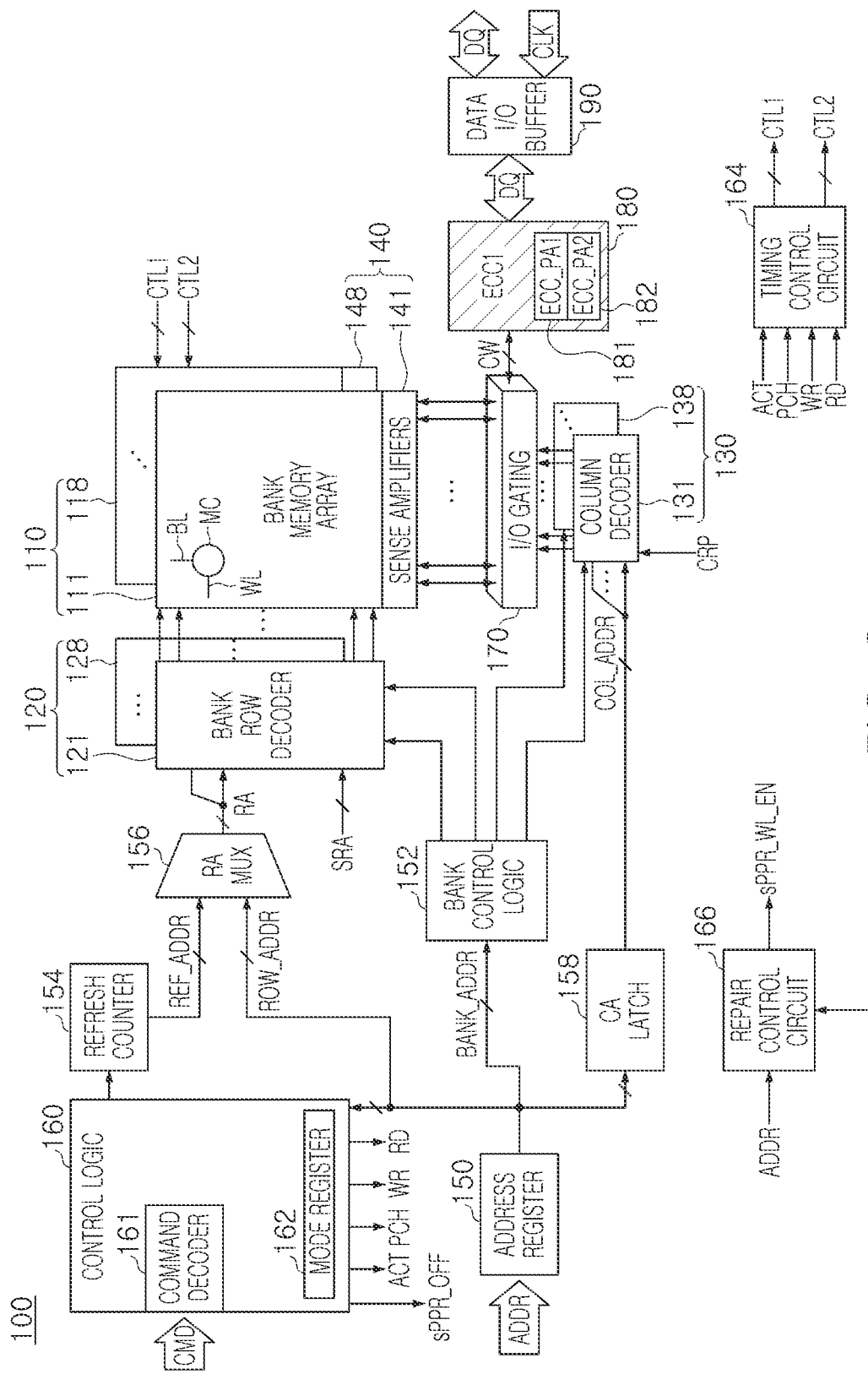
FIG. 2 is a diagram illustrating a memory device according to an embodiment of the present inventive concept.

FIG. 2 is a diagram illustrating a memory device 100 (MD) according to an embodiment of the present inventive concept. Referring to FIG. 2, a memory device 100 may include a memory cell array 110, a row decoder 120, a column decoder 130, a sense amplifier circuit 140, an address register 150, a bank control logic 152, a refresh counter 154, a row address multiplexer 156, a column address latch 158, a control logic 160, a repair control circuit 166, a timing control circuit 164, an input/output gating circuit 170, an error correction circuit 180, and a data input/output buffer 190.

The memory cell array 110 may include first to eighth banks 111 to 118, and it should be understood that the number of banks of the memory cell array 110 is not limited thereto. The row decoder 120 may include first to eighth bank row decoders 121 to 128 respectively connected to the first to eighth banks 111 to 118. The column decoder 130 may include first to eighth bank column decoders 131 to 138 respectively connected to the first to eighth banks 111 to 118.

The sense amplifier circuit 140 may include first to eighth bank sense amplifiers 141 to 148 respectively connected to the first to eighth banks 111 to 118. The first to eighth banks 111 to 118 may be configured with the first to eighth bank row decoders 121 to 128, the first to eighth bank column decoders 131 to 138, and the first to eighth bank sense amplifiers 141 to 148. Each of the first to eighth banks 111 to 118 may include a plurality of memory cells MC formed at points at which wordlines WL and bitlines BL intersect.

The address register 150 may receive and store an address ADDR having a bank address BANK_ADDR, a row address ROW_ADDR, and a column address COL_ADDR from an external memory controller. The address register 150 may provide the received bank address BANK_ADDR to the bank control logic 152, may provide the received row address ROW_ADDR to the row address multiplexer 156, and may provide the received column address COL_ADDR to the column address latch 158.

The bank control logic 152 may generate bank control signals in response to the bank address BANK_ADDR. In response to the bank control signals, a bank row decoder corresponding to the bank address BANK_ADDR, among the first to eighth bank row decoders 121 to 128, may be activated. In response to the bank control signals, a bank column decoder corresponding to the bank address BANK_ADDR, among the first to eighth bank column decoders 131 to 138, may be activated.

The row address multiplexer 156 may receive the row address ROW_ADDR from the address register 150, and may receive a refresh row address REF_ADDR from the refresh counter 154. The row address multiplexer 156 may selectively output the row address ROW_ADDR or the refresh row address REF_ADDR as a row address RA. The row address RA output from the row address multiplexer 156 may be applied to the first to eighth bank row decoders 121 to 128, respectively.

The bank row decoder activated by the bank control logic 152, among the first to eighth bank row decoders 121 to 128, may decode the row address RA output from the row address multiplexer 156, to activate a wordline corresponding to the row address RA. For example, the activated bank row decoder may apply a wordline driving voltage to the wordline corresponding to the row address RA. In addition, the activated bank row decoder may activate a redundancy wordline corresponding to a redundancy row address output from the repair control circuit 166 at the same time as activating the wordline corresponding to the row address RA.

The column address latch 158 may receive the column address COL_ADDR from the address register 150, and may temporarily store the received column address COL_ADDR. Also, the column address latch 158 may gradually increase the received column address COL_ADDR in a burst mode. The column address latch 158 may apply the temporarily stored or gradually increased column address COL_ADDR to the first to eighth bank column decoders 131 to 138, respectively.

Among the first to eighth bank column decoders 131 to 138, the bank column decoder activated by the bank control logic 152 may activate a sense amp corresponding to the bank address BANK_ADDR and the column address COL_ADDR through the input/output gating circuit 170. Also, the activated bank column decoder may perform a column repair operation in response to a column repair signal CRP output from the repair control circuit 166.

The control logic 160 may be implemented to control an operation of the memory device 100. For example, the control logic 160 may generate control signals such that the semiconductor memory device 100 performs a write operation or a read operation. The control logic 160 may include a command decoder 161 for decoding a command CMD received from the memory controller, and a mode register set 162 for setting an operation mode of the memory device 100.

For example, the command decoder 161 may decode a write enable signal (/WE), a row address strobe signal (/RAS), a column address strobe signal (/CAS), a chip select signal (/CS), or the like, to generate operation control signals ACT, PCH, WE, and RD, corresponding to the command CMD. The control logic 160 may provide the operation control signals: ACT, PCH, WE, and RD, to the timing control circuit 164. The operation control signals ACT, PCH, WR, and RD may include an active signal ACT, a precharge signal PCH, a write signal WR, and a read signal RD.

Input/output gating circuits of the input/output gating circuit 170 may include input data mask logic, read data latches for storing data output from the first to eighth banks 111 to 118, and write drivers for writing data to the first to eighth banks 111 to 118, in addition to circuits for gating input/output data. In addition, a code word (CW) to be read from one of the first to eighth banks 111 to 118 may be sensed by a sense amplifier corresponding to a single bank, and may be stored in the read data latches. The code word CW stored in the read data latches may perform ECC decoding by the error correction circuit 180, and may be then provided to the memory controller through the data input/output buffer 190. Data DQ to be written to one of the first to eighth banks 111 to 118 may be performed by ECC encoding in the error correction circuit 180, and may be then written to one bank by write drivers.

The data input/output buffer 190 may provide data DQ to the error correction circuit 180, based on the clock CLK provided from the memory controller, in a write operation, and may provide data DQ provided from the error correction circuit 180, to the memory controller, in a read operation.

The error correction circuit 180 (ECC1) may generate parity bits based on data bits of the data DQ provided from the data input/output buffer 190 in the write operation, and may provide a code word including the data DQ and the parity bits to the input/output gating circuit 170, and the input/output gating circuit 170 may write the code word to a bank. Also, the error correction circuit 180 may receive the code word CW read from one bank, from the input/output gating circuit 170, in the read operation. The error correction circuit 180 may correct at least one error bit included in the data DQ by performing ECC decoding on the data DQ using the parity bits included in the read code word CW, and may provide the corrected at least one error bit to the data input/output buffer 190.

In addition, the error correction circuit 180 may include first and second error correction units (ECC_PA1 and ECC_PA2, see FIG. 1) having different error correction capabilities in physical locations (e.g., bank position, array position, wordline position, or the like). A memory device 100 according to an embodiment of the present inventive concept may include an error correction circuit 180 having an optimal error correction capability according to different physical locations, to greatly improve data reliability.

Figure 3:
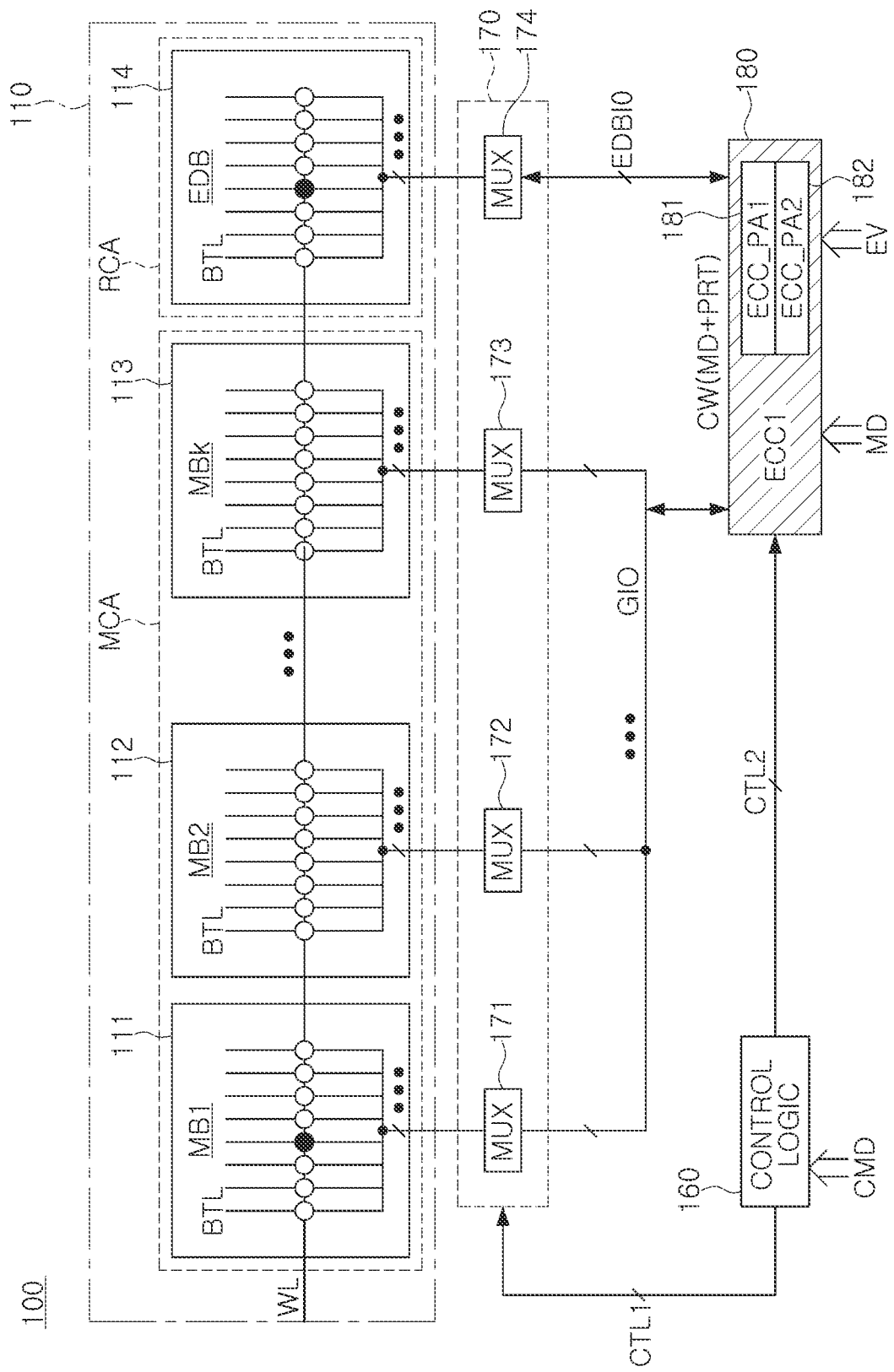
FIG. 3 is a diagram illustrating a portion of the memory device illustrated in FIG. 2.

FIG. 3 is a diagram illustrating a portion of the memory device 100 illustrated in FIG. 2. Referring to FIG. 3, the memory device 100 may include the memory array 110, the control logic 160, the memory array 110, the input/output gating circuit 170, and the ECC circuit 180. The memory array 110 may include a normal cell array NCA and a redundancy cell array RCA. The normal cell array NCA may include a plurality of first memory blocks MB1 to MBk (where, k is an integer equal to or greater than 2) (e.g., 111, 112, and 113), and the redundancy cell array RCA may include at least one second memory block EDB (e.g., 114). The first memory blocks MB1 to MBk may be blocks that determine memory capacity of the memory device 100. The second memory block EDB may be an ECC repair block or a redundancy repair block. The second memory block EDB may include memory cells for ECC or data line repair in order to recover defective cells generated in the first memory blocks MB1 to MBk. Each of the first memory blocks MB1 to MBk and the second memory block EDB may include a plurality of memory cells connected to wordlines and bitlines BTL. The input/output gating circuit 170 may include a plurality of switching circuits MUX (e.g., 171 to 174) connected to each of the memory blocks MB1 to MBk and EDB.

In order to support a burst length BL indicating the maximum number of column positions accessible by the memory device 100, bitlines BTL corresponding to the burst length may be simultaneously accessed. For example, the memory device 100 may set the burst length to 8. Therefore, the bitlines BTL may be respectively connected to column selection portions respectively connected to column select signals, and eight bitlines may be simultaneously selected by a single column selection portion.

The control logic 160 may decode the command CMD to provide a first control signal CTL1 to the switching circuits 171 to 174, and provide a second control signal CTL2 to the ECC circuit 180. The switching circuits 171 to 173 may connect the first memory blocks MB1 to MBk to first data lines GIO in response to the first control signal CTL1, and the switching circuit 174 may connect the second memory block EDB and second data lines EDPIO in response to the first control signal CTL1, in a normal mode. The ECC circuit 180 may perform ECC decoding and encoding operations in response to the second control signal CTL2 in the normal mode.

The switching circuits 171 to 173 may block the first memory blocks MB1 to MBk and the first data lines GIO in response to the first control signal CTL1, and the switching circuit 174 may block the second memory block EDB and the second data lines EDPIO in response to the first control signal CTL1, in a code verification mode.

The ECC circuit 180 may be connected to the switching circuits 171 to 174, through first data lines GIO and second data lines EDBIO respectively corresponding to the switching circuits 171 to 174. The ECC circuit 180 may perform ECC encoding on main data MD in a write operation in the normal mode to generate parity data PRT, and may store a code word CW including the main data MD and the parity data PRT in the first memory blocks MB1 to MBk and the second memory block EDB through the switching circuits 171 to 174. The ECC circuit 180 may receive the code word CW stored in the first memory blocks MB1 to MBk and the second memory block EDB through the switching circuits 171 to 172 in a read operation in the normal mode, and may perform ECC decoding on the main data MD to correct a bit error of the main data MD.

In addition, the ECC circuit 180 may store an error vector EV in the code verification mode, may perform ECC decoding using offset parity data stored therein with respect to the stored error vector EV, and may output an error vector EV indicating results of the ECC decoding. In an embodiment, the ECC circuit 180 may store an error vector EV in response to the second control signal CTL2 in the code verification mode, may perform ECC decoding using offset parity data stored therein with respect to the stored error vector EV, and may output an error vector EV indicating results of the ECC decoding.

In addition, the ECC circuit 180 may be implemented to perform error correction using different manners according to a physical location (e.g., a top/bottom bank, an odd/even WL, or the like). For example, the ECC circuit 180 may include a first error correction unit ECC_PA1 activated according to an odd address to be received, and a second error correction unit ECC_PA2 activated according to an even address to be received.

Figure 4:
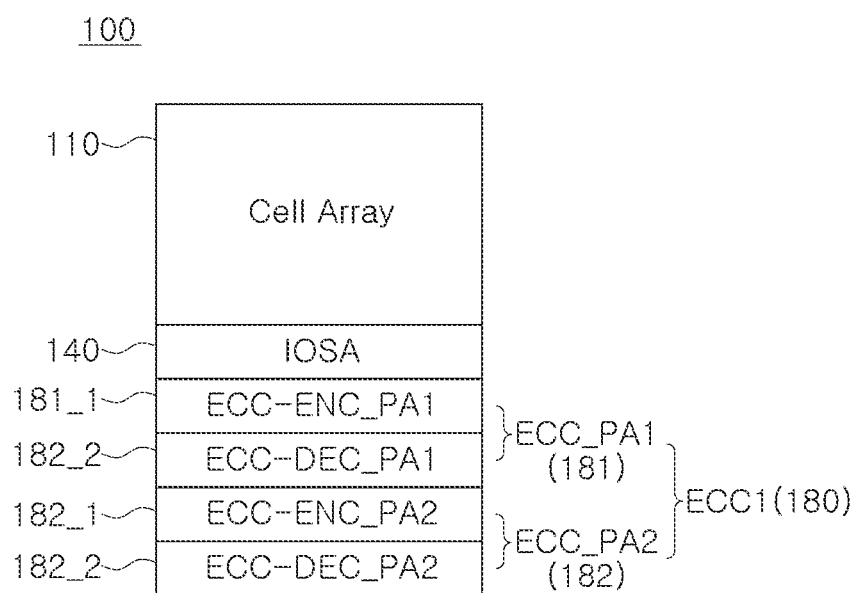
FIG. 4 is a block diagram conceptually illustrating a memory device according to an embodiment of the present inventive concept.

FIG. 4 is a block diagram conceptually illustrating a memory device 100 according to an embodiment of the present inventive concept. Referring to FIG. 4, a memory device 100 may include a cell array 110, a sense amplifier circuit (IOSA, 140), a first error correction encoder (181-1, ECC-ENC_PA1), a first error correction decoder (181-2, ECC-DEC_PA1), a second error correction encoder (182-1, ECC-ENC_PA2), and a second error correction decoder (182-2, ECC-DEC_PA2).

The first error correction encoder (181-1, ECC-ENC_PA1) and the first error correction decoder (181-2, ECC-DEC_PA1) may constitute a first error correction unit (181, ECC_PA1), and the second error correction encoder (182-1, ECC-ENC_PA2) and the second error correction decoder (182-2, ECC-DEC_PA2) may constitute a second error correction unit (182, ECC_PA2). The first error correction unit (181, ECC_PA1 and the second error correction unit (182, ECC_PA2) may configure an error correction circuit (ECC1, 180).

When an address indicates an odd wordline, the first error correction encoder 181-1 may generate a first check bit of write data in a write operation. When the address indicates an odd wordline, the first error correction decoder 181-2 may correct an error in read data using the first check bit in a read operation. When the address indicates an even wordline, the second error correction encoder 182-1 may generate a second check bit of the write data in the write operation. When the address indicates an even wordline, the second error correction decoder 182-2 may correct an error in the read data using the second check bit in the read operation.

In an embodiment, the first error correction encoder 181-1 and the second error correction encoder 182-1 may generate check bits using different manners according to a physical location (e.g., a bank address, a row address, or the like). In another embodiment, the first error correction decoder 181-2 and the second error correction decoder 182-2 may correct a single bit error in the same manner.

In still another embodiment, the first error correction decoder 181-2 and the second error correction decoder 182-2 may use different error correction codes for multi-bit error correction. For example, the first error correction decoder 181-2 and the second error correction decoder 182-2 may perform an error correction operation using different H-matrices.

In another embodiment, the first error correction decoder 181-2 and the second error correction decoder 182-2 may use the same error correction code for multi-bit error correction, but may operate with different data permutations.

Figure 5A:
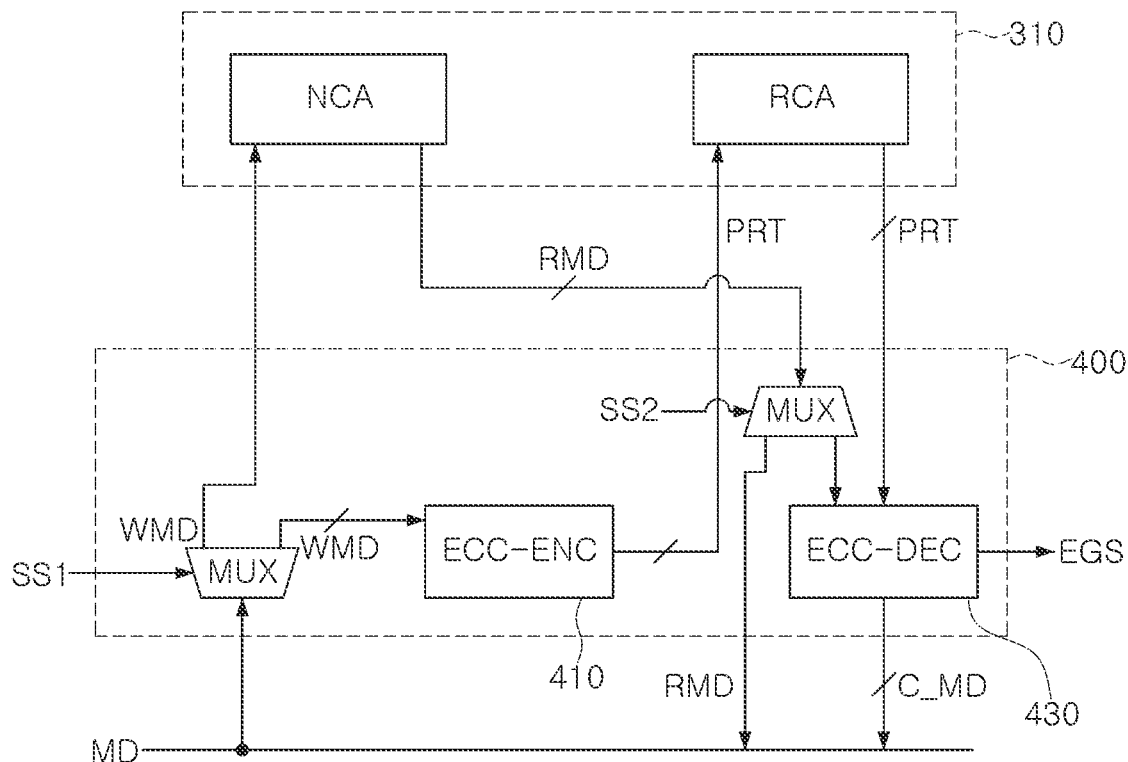
FIGS. 5A, 5B, and 5C are diagrams illustrating an error correction circuit of a memory device 100 according to an embodiment of the present inventive concept in more detail.
Figure 5B:
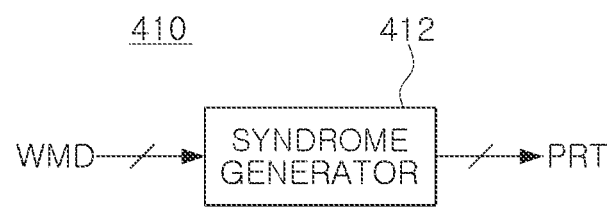
Figure 5C:
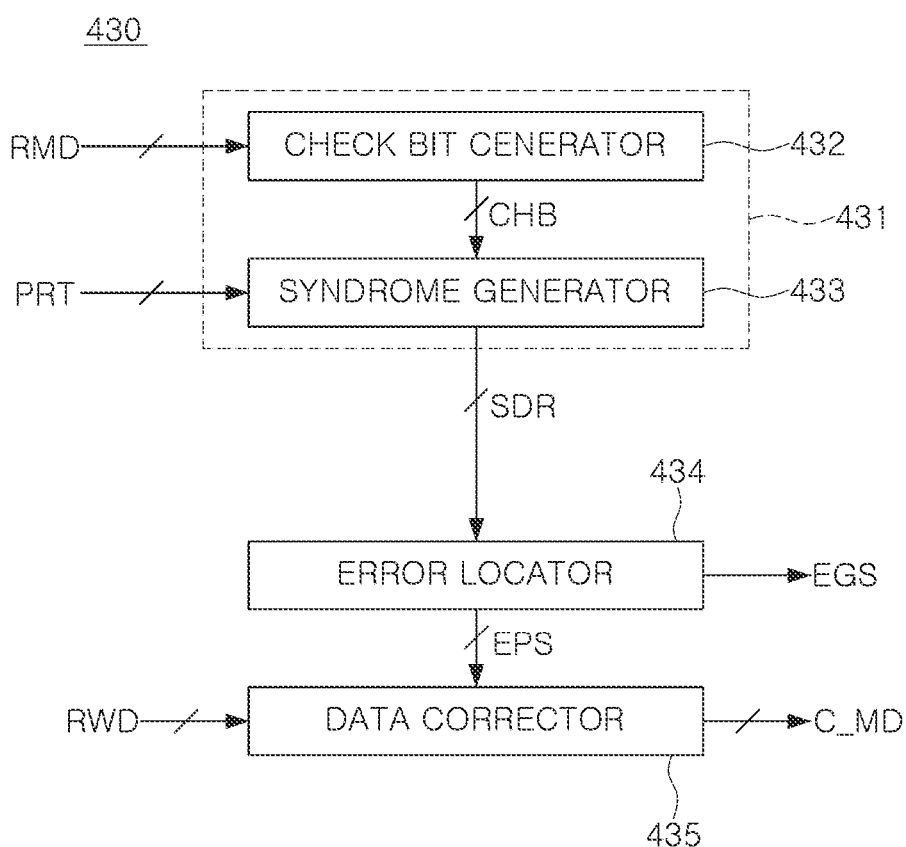

FIGS. 5A, 5B, and 5C are diagrams illustrating an error correction circuit of a memory device 100 according to an embodiment of the present inventive concept in more detail. Referring to FIG. 5A, an ECC engine 400 may include an ECC encoder 410 and an ECC decoder 430. A selection circuit MUX may provide main data MD to one of a normal cell array NCA and the ECC encoder 410 in response to a first selection signal SS1. The ECC encoder 410 may generate parity bits PRT related to write data WMD to be stored in the normal cell array NCA of a memory cell array 310. The selection circuit MUX may provide read data RMD read from the memory cell array 310 to a data input/output buffer or to the ECC decoder 430 in response to a second selection signal SS2. The ECC decoder 430 may perform ECC decoding on the read data RMD using the read data RMD and the parity bits PRT. As a result of the ECC decoding, when the read data RMD includes at least one error bit, the ECC decoder 430 may provide an error generation signal EGS to a control logic circuit 210, and may correct an error bit of the read data RMD to output a corrected main data C_MD. The ECC encoder 410 may perform ECC encoding using a single error correction (SEC) code, and the ECC decoder 430 may perform ECC decoding using the SEC code. The first selection signal SS1 and the second selection signal SS2 may be included in a second control signal CTL2.

FIG. 5B is a diagram illustrating the ECC encoder of FIG. 5A. Referring to FIG. 5B, the ECC encoder 410 may include a syndrome generating circuit 412. The syndrome generating circuit 412 may receive the write data WMD, and may generate the parity bits PRT.

Referring to FIG. 5C, the ECC decoder 430 may include a syndrome generating circuit 431, an error locator 434, and a data corrector 435. The syndrome generating circuit 431 may include a check bit generator 432 and a syndrome generator 433. The check bit generator 432 may generate check bits CHB, based on the read data RMD, using an XOR array operation. The syndrome generator 433 may compare the parity bits PRT and rising bits of the check bits CHB, to generate a syndrome SDR.

When all bits of the syndrome SDR are not zero, the error locator 434 may decode the syndrome SDR, and may output an error position signal EPS indicating the position of the error bit included in the read data RMD to the data corrector 435. Also, when the error bit is included in the read data RMD, the error locator 434 may provide the error generation signal EGS to the control logic circuit.

When the data corrector 435 receives a read data RMD, and the read data RMD includes an error bit, the data corrector 435 may correct the error bit of the read data RMD based on the error position signal EPS, and may output a corrected main data C_MD.

In general, faults of a memory device may be classified according to whether they affect all data during a read access. When a fault affects all data, it may be known as an unbounded fault, and when a fault affects some data, it may be known as a more limited, bounded fault. For this reason, types of faults may be classified as a sub cache line fault and a full cache line fault.

Figure 6A:
FIGS. 6A, 6B, and 6C are diagrams illustrating a fault pattern of a memory device according to an embodiment of the present inventive concept.
Figure 6B:
Figure 6C:
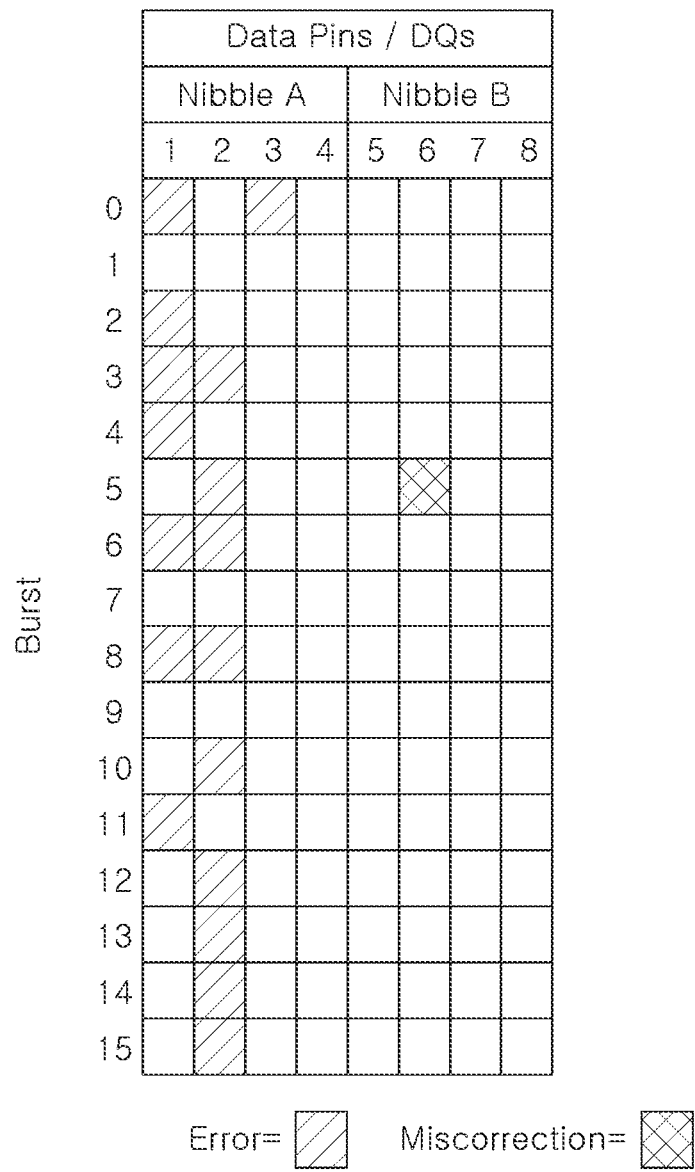

FIGS. 6A, 6B, and 6C are diagrams illustrating a fault pattern of a memory device according to an embodiment of the present inventive concept. Referring to FIGS. 6A and 6B, a sub cache line fault in which a fault occurs in two DQs of any one of nibbles A and B is illustrated. Referring to FIG. 6C, a multi-bit error and a miscorrection are illustrated.

Figure 7:
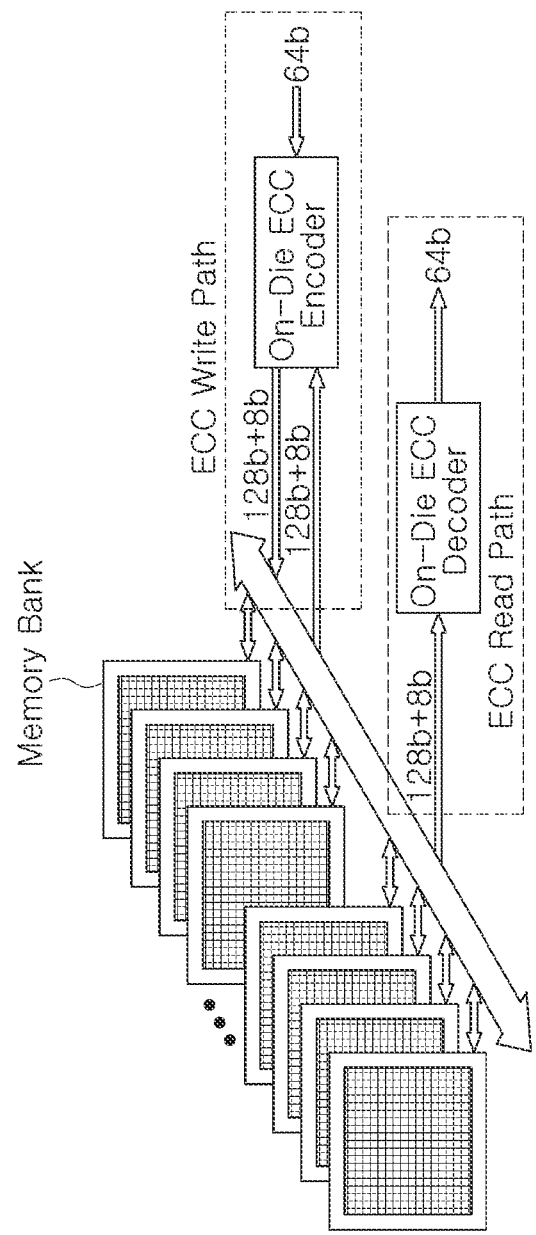
FIG. 7 is a diagram illustrating a read path and a write path of a memory device according to an embodiment of the present inventive concept.

FIG. 7 is a diagram illustrating a read path and a write path of a memory device according to an embodiment of the present inventive concept. Referring to FIG. 7, during a read operation, 128 data bits and 8 check bits may be read from a memory bank. During a write operation, a read-modify-write (RMW) operation may be performed. 128 data bits and 8 check bits may be read from a memory bank, and the read data may be corrected. New data will be merged therein, and new ECC bits will be computed.

A memory device 100 according to an embodiment of the present inventive concept may use an on-die error correction code in consideration of a non-single bit (NSB) error pattern or a multi-bit error pattern according to a physical location. A general memory device may receive a row address from an OD-ECC decoder and may correct adjacent 2-bit errors, when forms in which the adjacent 2-bit errors in odd wordlines/even wordlines are generated are different from each other. When a CSL/SWL/SWD fault occurs, an error at a system level may not be corrected due to miscorrection of an OD-ECC.

A memory device 100 according to an embodiment of the present inventive concept may be implemented that an OD-ECC (ECC1, a first error correction circuit) corrects the NSB error, or miscorrection of an OD-ECC is generated in a correctable region in a system ECC (ECC2, a second error correction circuit), when positions in which an NSB error occurs in data are different for each fault according to a physical location. In an embodiment, the memory device 100 may include an OD-ECC that receives a physical location (e.g., a row address, a bank address, or the like) and performs ECC encoding/decoding. In an embodiment, the memory device 100 may include OD-ECCs having different correctable error patterns according to a physical location. In an embodiment, the memory device 100 may include OD-ECCs having different generation regions of miscorrection when an error exceeding correction capability occurs according to a physical location.

A memory device 100 according to an embodiment of the present inventive concept may correct adjacent 2-bit errors using multiple OD-ECCs for each position, when the adjacent 2-bit errors are differently generated according to a physical location. In addition, a memory device 100 according to an embodiment of the present inventive concept may be configured such that, miscorrection of an OD-ECC may be generated in a correctable region in a system ECC for each position, when positions in which an NSB error of data for each fault (CSL/SWL/SWD fault) is generated are different according to a physical location (e.g., a top/bottom bank, an odd/even WL, or the like). And, a memory device 100 according to an embodiment of the present inventive concept may correct adjacent 2-bit errors of an odd/even WL in an OD-ECC, and may correct errors due to corresponding faults in a system ECC, when a CSL/SWL/SWD fault occurs.

FIG. 8A is a diagram illustrating ECC bound and ECC gathering for odd wordlines of a memory device according to an embodiment of the present inventive concept, and FIG. 8B is a diagram illustrating ECC bound and ECC gathering for even wordlines of a memory device according to an embodiment of the present inventive concept. In this case, the ECC bound region indicates a range of an NSB error when a cache line fault occurs, and the ECC gathering region indicates a range of miscorrection of an OD-ECC.

Referring to FIGS. 8A and 8B, an ECC bound region of an odd wordline may be different from an ECC bound region of an even wordline. For example, an NSB error correction pattern or an OD-ECC miscorrection region may be different from each other, depending on a wordline.

Referring to FIG. 8A, in an odd wordline, an ECC bound region and an ECC gathering region coincide with each other. Referring to FIG. 8B, in an even wordline, an ECC bound region and an ECC gathering region coincide with each other.

Figure 9A:
FIGS. 9A and 9B are diagrams illustrating an error bound region and an error gathering region for an odd wordline of a top bank of a memory device according to an embodiment of the present inventive concept.
Figure 9B:

FIGS. 9A and 9B are diagrams illustrating an error bound region and an error gathering region for an odd wordline of a top bank of a memory device according to an embodiment of the present inventive concept.

Referring to FIG. 9A, in an odd wordline of a top bank, adjacent 2-bit errors in the same DQ may occur at (BL0, BL1), (BL2, BL3), . . . , (BL14, BL15). When a CSL/SWL/SWD fault occurs in the odd wordline of the top bank, NSB errors may occur in [DQ0, DQ1], [DQ2, DQ3], [DQ4], [DQ5, DQ6], and [DQ7]. For example, in the odd WL, errors may not occur at the same time in DQ1 and DQ2 due to the CSL/SWL/SWD fault.

Referring to FIG. 9B, when designing an OD-ECC for an odd wordline of a top bank, the OD-ECC may be designed such that an single bit error is corrected and adjacent 2-bit errors occurring in a form of (BL0, BL1), (BL2, BL3), . . . , (BL14, BL15) in the same DQ are corrected.

Assuming that any 2-DQ error in DQ0 DQ3 or DQ4 DQ7 may be corrected in a system ECC, in designing an OD-ECC for an odd wordline in a top bank, when an NSB error occurs in [DQ0, DQ1] by a CSL/SWL/SWD fault, the OD-ECC may be designed such that miscorrection of the OD-ECC occurs in [DQ0, DQ1]. Similarly, when an NSB error occurs in [DQ2, DQ3], [DQ4], [DQ5, DQ6], and [DQ7] due to a CSL/SWL/SWD fault, the OD-ECC may be designed such that miscorrection of the OD-ECC occurs in [DQ2, DQ3], [DQ4], [DQ5, DQ6], and [DQ7]], respectively.

Figure 10A:
Figure 10B:
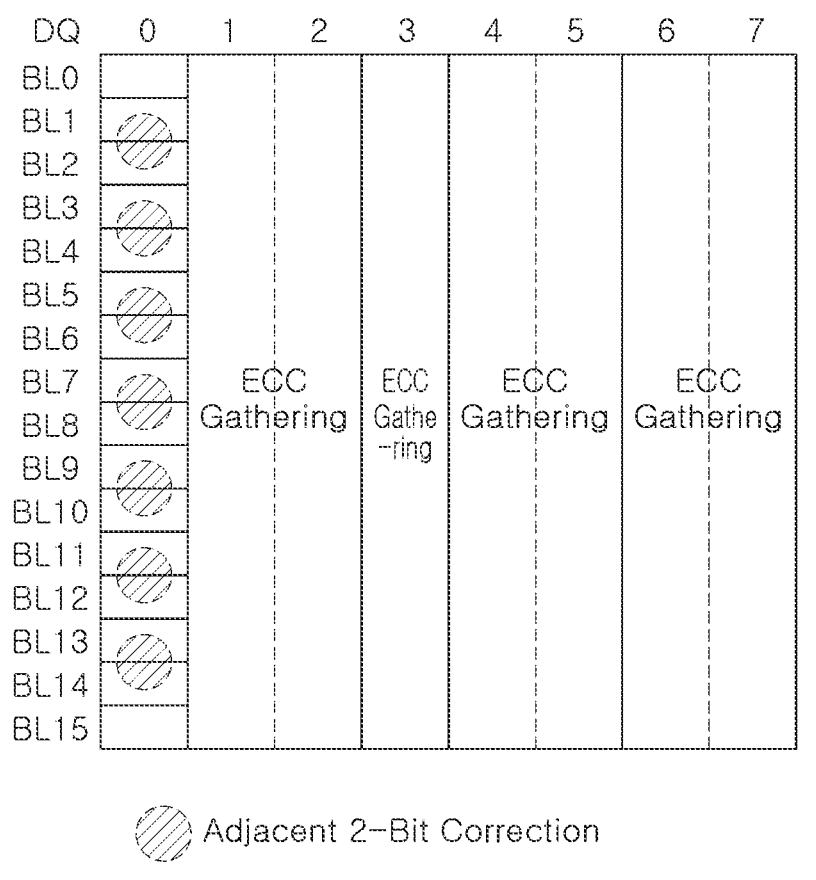

FIGS. 10A and 10B are diagrams illustrating an error bound region and an error gathering region for an even wordline of a top bank of a memory device according to an embodiment of the present inventive concept.

Referring to FIG. 10A, in an even WL of a top bank, adjacent 2-bit errors in the same DQ may occur at (BL1, BL2), (BL3, BL4), . . . , (BL13, BL14). In the even WL, NSB errors may occur in [DQ0], [DQ1, DQ2], [DQ3], [DQ4, DQ5], and [DQ6, DQ7].

Referring to FIG. 10B, when designing an OD-ECC for an even WL of a top bank, the OD-ECC may be designed such that an single bit error is corrected and adjacent 2-bit errors occurring in a form of (BL1, BL2), (BL3, BL4), . . . , (BL13, BL14) in the same DQ are corrected. Assuming that any 2-DQ error in DQ0 DQ3 or DQ4 DQ7 may be corrected in a system ECC, in designing an OD-ECC for an even WL in a top bank, when an NSB error occurs in [DQ0] by a CSL/SWL/SWD fault, the OD-ECC may be designed such that miscorrection of the OD-ECC occurs in [DQ0]. Similarly, when an NSB error occurs in [DQ1, DQ2], [DQ3], [DQ4, DQ5], and [DQ6, DQ7] due to a CSL/SWL/SWD fault, the OD-ECC may be designed such that miscorrection of the OD-ECC occurs in [DQ1, DQ2], [DQ3], [DQ4, DQ5], and [DQ6, DQ7], respectively.

Figure 11A:
FIGS. 11A and 11B are diagrams illustrating an error bound region and an error gathering region for an odd wordline of a bottom bank of a memory device according to an embodiment of the present inventive concept.
Figure 11B:
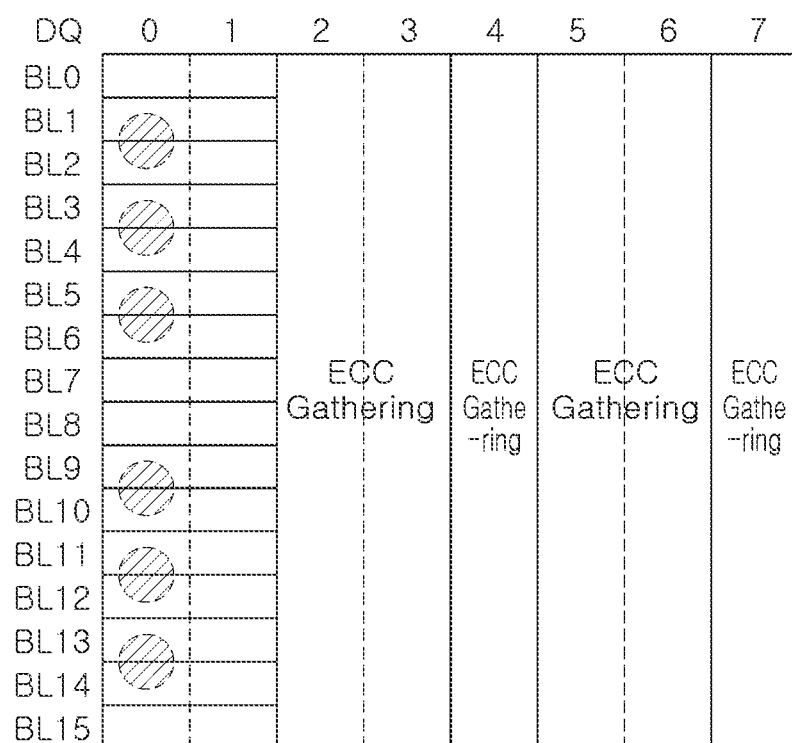

FIGS. 11A and 11B are diagrams illustrating an error bound region and an error gathering region for an odd wordline of a bottom bank of a memory device according to an embodiment of the present inventive concept. Referring to FIG. 11A, an error bound region due to adjacent 2-bit errors and a CSL/SWL/SWD fault considered in an odd WL of a bottom bank is illustrated. Referring to FIG. 11B, SEC correction and S2EC correction in an odd WL are possible. Also, when a CSL/SWL/SWD fault occurs, miscorrection of an OD-ECC may exist in the error bound region, to be corrected in a system ECC.

Figure 12A:
FIGS. 12A and 12B are diagrams illustrating an error bound region and an error gathering region for an even wordline of a bottom bank of a memory device according to an embodiment of the present inventive concept.
Figure 12B:
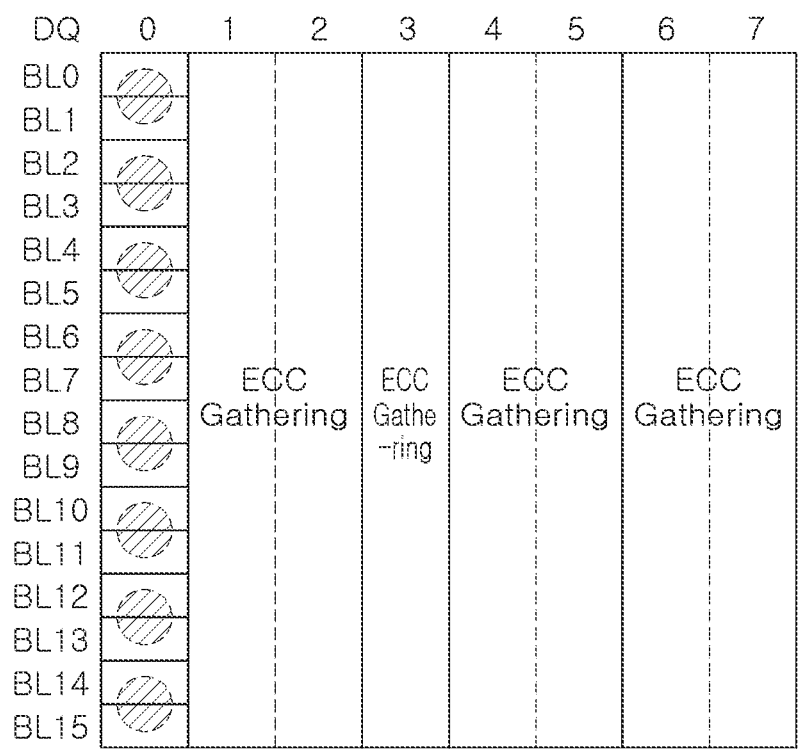

FIGS. 12A and 12B are diagrams illustrating an error bound region and an error gathering region for an even wordline of a bottom bank of a memory device according to an embodiment of the present inventive concept. Referring to FIG. 12A, an error bound region due to adjacent 2-bit errors and a CSL/SWL/SWD fault considered in an even WL of a bottom bank is illustrated. Referring to FIG. 12B, SEC correction and S2EC correction in an odd WL are possible using an OD-ECC (an S2EC code) for an even WL of a bottom bank. When a CSL/SWL/SWD fault occurs, miscorrection of an OD-ECC may exist in the error bound region, to be corrected in a system ECC.

In a memory device according to an embodiment of the present inventive concept, when ranges in which an NSB error occurs in data are different for an SWD fault according to a physical location, miscorrection of a first ECC may occur in a correctable region by a second ECC for each position. Also, in a memory device according to an embodiment of the present inventive concept, when positions in which adjacent 2-bit errors occur in data are different according to a physical location, SBE and the adjacent 2-bit error may be corrected for each position.

Figure 13:
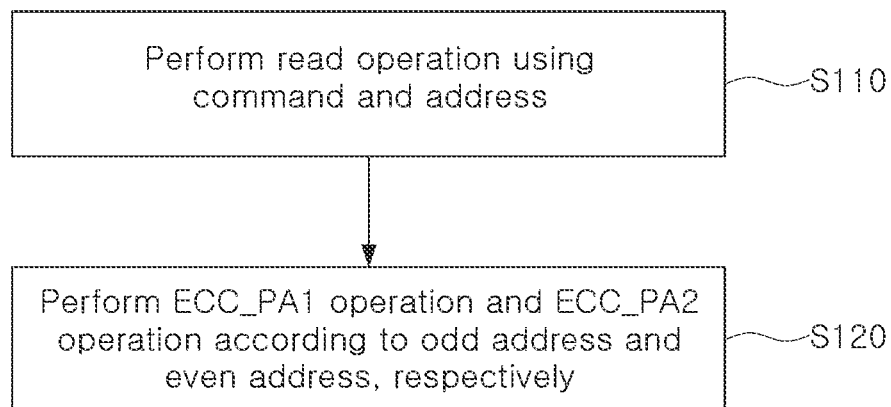
FIG. 13 is a flowchart illustrating a method of operating a memory device according to an embodiment of the present inventive concept.

FIG. 13 is a flowchart illustrating a method of operating a memory device according to an embodiment of the present inventive concept. Referring to FIG. 13, a memory device 100 may receive a read command and an address (S110). When the received address is an odd address, the memory device 100 may execute a first error correction unit ECC_PA1 in a read operation corresponding to the read command. Also, when the received address is an even address, the memory device 100 may execute a second error correction unit ECC_PA2 in the read operation corresponding to the read command (S120). In this case, the first and second error correction units ECC_PA1 and ECC_PA2 may perform different ECC decoding.

Figure 14:
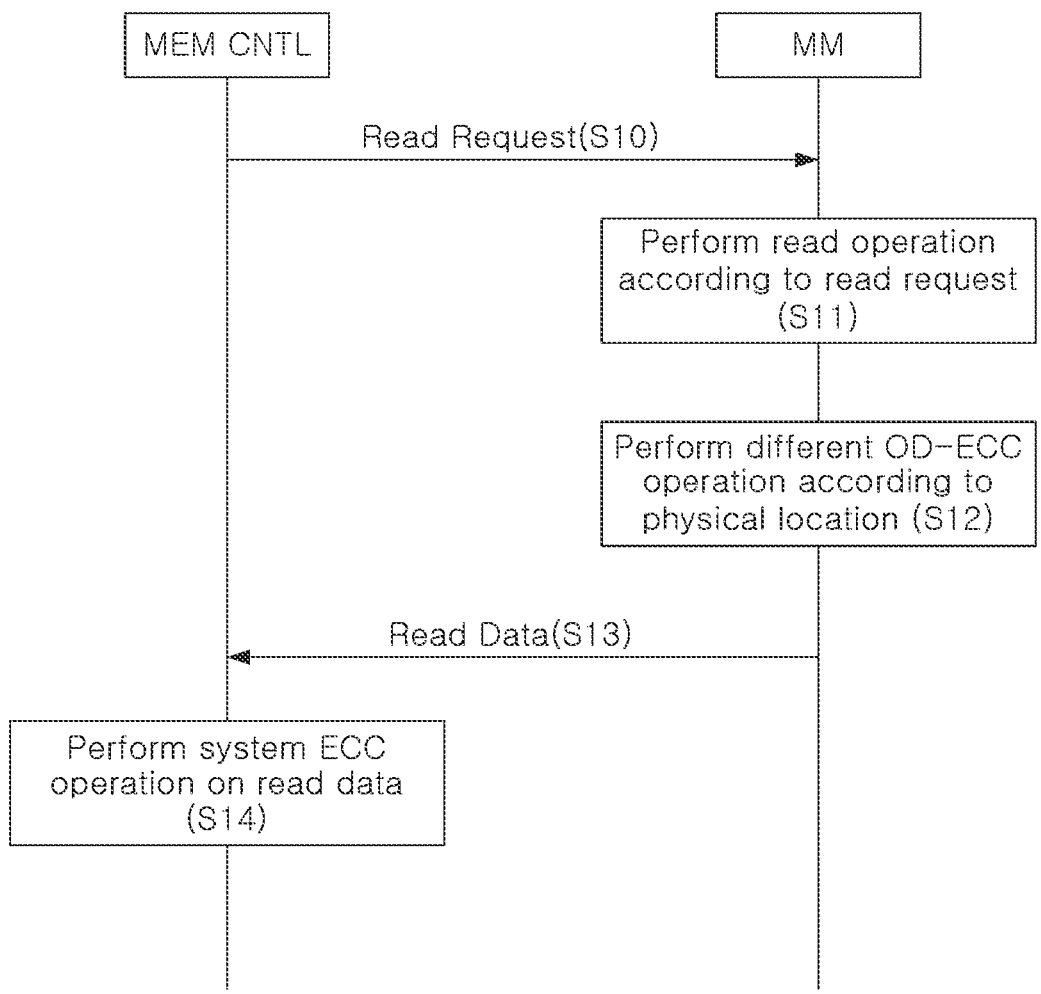
FIG. 14 is a ladder diagram illustrating a method of operating a memory system according to an embodiment of the present inventive concept.

FIG. 14 is a ladder diagram illustrating a method of operating a memory system according to an embodiment of the present inventive concept. Referring to FIG. 14, a method of operating a memory system may proceed as follows.

A memory controller MEM CNTL may transmit a read request to a memory module MM (S10). The memory module MM may perform a read operation according to the read request (S11). In this case, an error of read data may be corrected by performing different first ECC operations according to a physical location (S12). The error-corrected data may be output to the memory controller MEM CNTL (S13). The memory controller MEM CNTL may receive data from the memory module MM, and may perform a second ECC operation on the received data (S14).

In an embodiment, a multi-bit error may be a 2-bit error. In an embodiment, interleaving of read data may be performed according to a physical location, and a multi-bit error of the interleaved data may be corrected. In an embodiment, correctable miscorrection may occur in a second error correction operation (a system error correction operation) according to a physical location. In an embodiment, the physical location may indicate a top/bottom bank or an odd/even wordline.

In an embodiment, sub wordline driver (SWD) coding of a top bank and a bottom bank may be implemented to have a mirror structure with each other. In an embodiment, memory cells of the top bank and the bottom bank may be implemented to have a shift structure. Therefore, positions of failed memory cells may be different according to positions of the top/bottom bank or the odd/even wordline.

Figure 15:
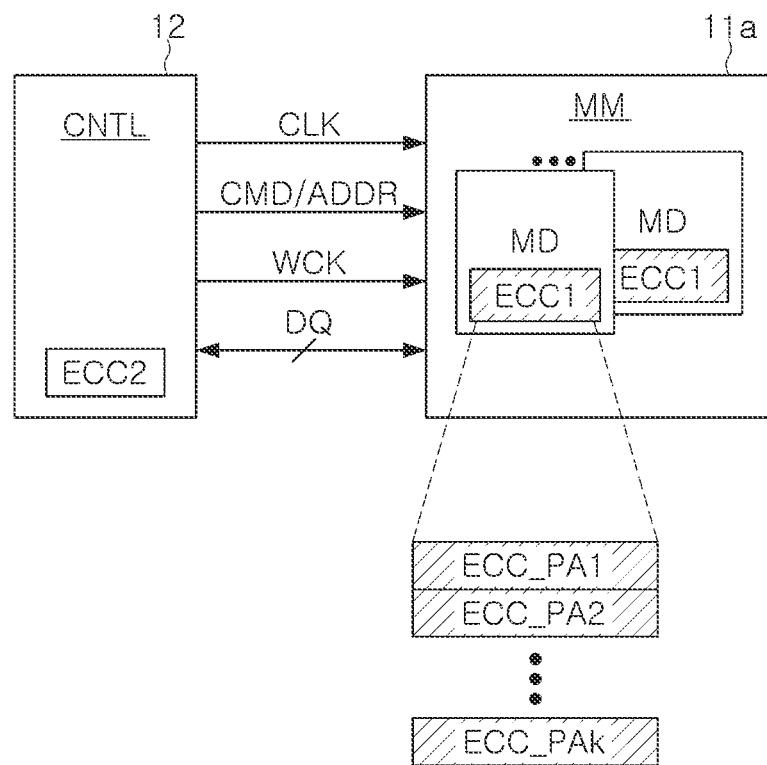
FIG. 15 is a diagram illustrating a memory system according to another embodiment of the present inventive concept.

FIG. 15 is a diagram illustrating a memory system 20 according to another embodiment of the present inventive concept. Referring to FIG. 15, a memory system 20 may be different from those illustrated in FIG. 1, in view of the fact that a memory device MD having k error correction units (where k is an integer equal to or greater than 3) is included.

In an embodiment, a plurality of memory devices MD may include a plurality of error correction units ECC_PA1 to ECC_PAk that perform different on-die error correction operations according to a physical location. In an embodiment, the physical location may include a bank address or a row address. In an embodiment, the on-die error correction operations may be characterized in that miscorrection is generated in a correctable region in a system error correction operation. In an embodiment, each of the plurality of memory devices MD may interleave data according to a physical location, and may correct an error of the interleaved data in an on-die error correction operation. A memory device of the present inventive concept may not have different OD-ECCs according to a physical location, but may have the same OD-ECCs and may perform data interleaving according to the physical location to thereby obtain the same effect.

FIG. 16 is a flowchart illustrating a method of operating a memory device according to another embodiment of the present inventive concept. Referring to FIG. 16, after receiving a command and an address (S210), a memory device may determine whether to interleave read data using the received address (S220). The memory device may perform an error correction operation on the read data or the interleaved data in an OD-ECC, according to the received address (S230).

FIG. 17 is a diagram illustrating performance of an error correction code according to an embodiment of the present inventive concept. Referring to FIG. 17, a SEC code satisfied bound fault (BF) conditions although adjacent 2-bit error correction was impossible. A prior S2EC code may correct adjacent 2-bit error, but only partially satisfied the BF conditions. A S2EC code of the present inventive concept satisfied the BF conditions while adjacent 2-bit error correction being possible.

Figure 18:
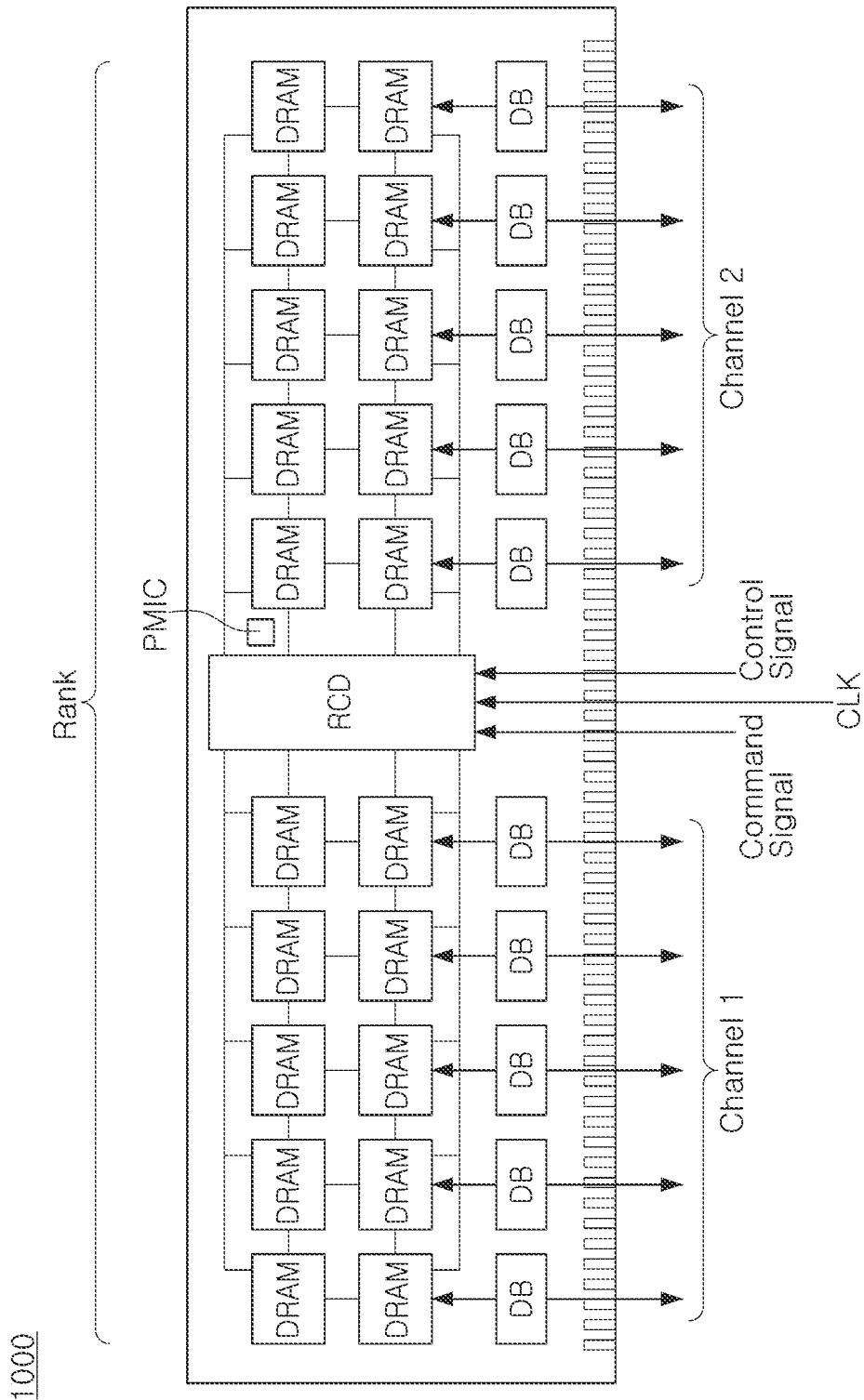
FIG. 18 is a diagram illustrating a memory module according to an embodiment of the present inventive concept.

FIG. 18 is a diagram illustrating a memory module 1000 according to an embodiment of the present inventive concept. Referring to FIG. 18, a memory module 1000 may include a plurality of memory chips (e.g., DRAM) respectively including a memory cell array, a buffer chip (e.g., RCD) for routing transmission/reception signals with a memory controller or managing memory operations for memory chips, and a power management chip PMIC. A plurality of memory chips may be implemented to perform different OD-ECC according to a physical location, as described with reference to FIGS. 1 to 17.

An RCD may control the memory chips DRAM and the power management chip PMIC under control of the memory controller. For example, the RCD may receive a command signal, a control signal, and a clock signal, from the memory controller. The memory chips DRAM may be respectively connected to corresponding data buffers, among data buffers DB, through a corresponding data transmission lines, to transmit and receive a data signal DQ and a data strobe signal DQS. The memory chips DRAM may be respectively connected to the data buffer DB through corresponding data transmission lines, to transmit and receive parity data PRT and data strobe signal DQS.

An SPD chip (not illustrated) may be a programmable read only memory (EEPROM). The SPD chip may include initial information or device information of the memory module 1000. For example, the SPD chip 580 may include initial information or device information such as a module shape, module configuration, storage capacity, a module type, execution environment, and the like of the memory module 1000. When a memory system including the memory module 1000 is booted, the memory controller may read the device information from the SPD chip and may recognize the memory module 1000 based on the read device information.

In an embodiment, a rank may include eight bank groups. Each of the bank groups may include four banks. In an embodiment, the memory chips may be classified as first channel-only memory chips and second channel-only memory chips.

Figure 19:
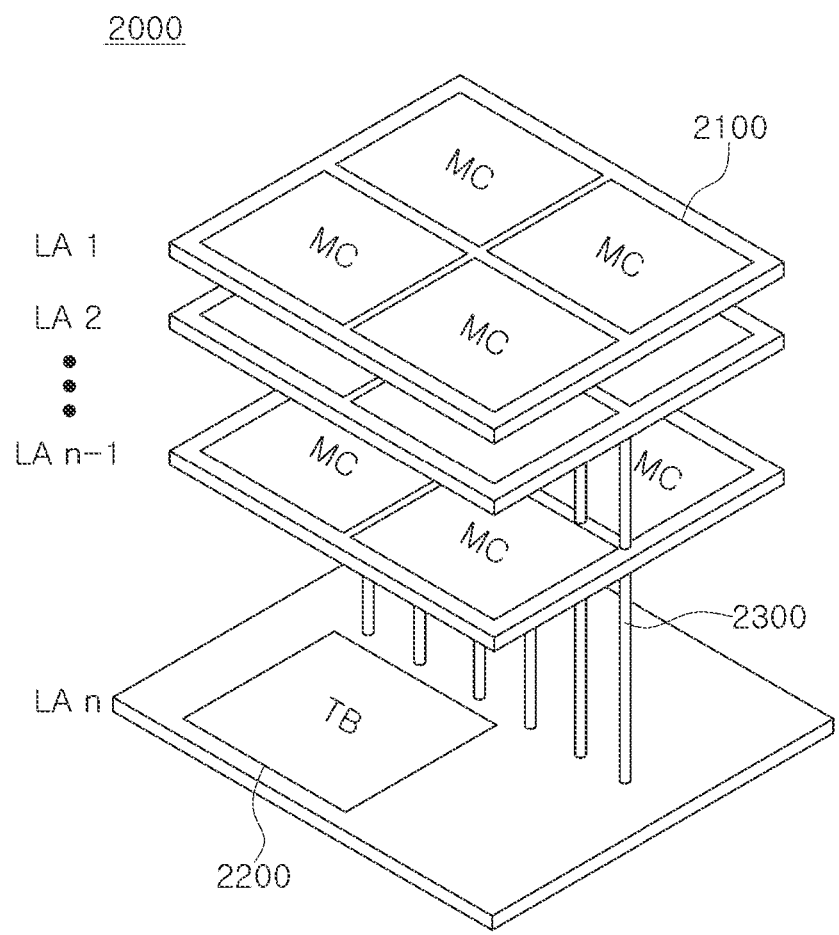
FIG. 19 is a block diagram illustrating a semiconductor package having a stack structure including a plurality of layers according to an embodiment of the present inventive concept.

FIG. 19 is a block diagram illustrating a semiconductor package having a stack structure including a plurality of layers according to an embodiment of the present inventive concept. Referring to FIG. 19, a semiconductor package 2000 may include a plurality of layers LA1 to LAn. A first layer LA1 to an n-1$^{th}$ layer LAn may be memory layers (or memory chips) respectively including a plurality of memory cores MC. The memory cores MC may include a memory cell array for storing data, a row decoder, a column decoder, a sense amplifier circuit, and an error correction circuit, respectively. In particular, the error correction circuit of the present inventive concept may be implemented to perform different ECC operations according to a physical location. For example, different ECC operations may be performed for each of the layers.

An n$^{th}$ layer LAn may be a buffer layer (or a buffer chip). In the semiconductor package 2000, the layers LA1 to LAn, which are in a stack structure, may be interconnected through a through silicon via (TSV) 2300. The buffer layer LAn may communicate with an external memory controller and the memory layers LA1 to LAn−1, and may route transmission/reception signals between the memory layers LA1 to LAn−1 and the memory controller. Furthermore, the buffer layer LAn may queue signals received from the memory controller or the memory layers LA1 to LAn−1. Also, the buffer layer LAn may include a training block 2200. The buffer layer LAn may perform a training operation on the memory layers LA1 to LAn−1 using the training block 2200.

Figure 20:
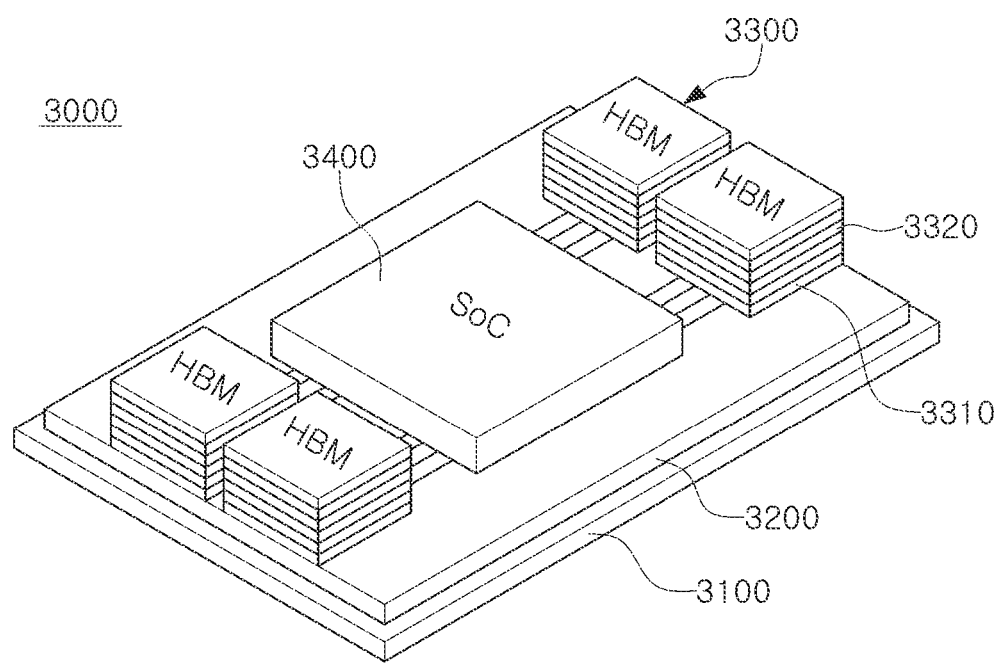
FIG. 20 is a diagram illustrating a semiconductor package including a stacked semiconductor chip according to an embodiment of the present inventive concept.

FIG. 20 is a diagram illustrating a semiconductor package including a stacked semiconductor chip according to an embodiment of the present inventive concept. Referring to FIG. 20, a semiconductor package 3000 may be a memory module including at least one stack semiconductor chip 3300 and a system-on-chip (SOC) 3400, mounted on a package substrate 3100 such as a printed circuit board. An interposer 3200 may be optionally further provided on the package substrate 3100. The stack semiconductor chip 3300 may be formed of a chip-on-chip (CoC).

The stack semiconductor chip 3300 may include at least one memory chip 3320 stacked on a buffer chip 3310 such as a logic chip. The memory chip 3320 may be implemented to perform different OD-ECC operations according to a physical location, as described with reference to FIGS. 1 to 17.

The buffer chip 3310 and the at least one memory chip 3320 may be connected to each other by a through silicon via (TSV). The buffer chip 3320 may perform a training operation on the memory chip 3320. The stack semiconductor chip 3300 may be, for example, a high bandwidth memory (HBM) of 500 GB/sec to 1 TB/sec, or more.

An OD-ECC according to an embodiment of the present inventive concept may satisfy a bounded fault (BF) condition while enabling S2EC to correct an adjacent 2-bit error. In this case, the BF condition refers that miscorrection of an OD-ECC occurs in a correctable region in a system ECC, when a sub cache line fault occurs. Error bound refers to a range of an NSB error when a sub cache line fault occurs, and ECC gathering refers to a range of miscorrection of an OD-ECC.

When positions in which an NSB error occurs in data due to sub cache line fault are different according to a physical location in DRAM, the present inventive concept may apply a plurality of OD-ECC for each position, such that miscorrection of the OD-ECC satisfies the BF condition and S2EC is corrected.

When ranges in which an NSB error occurs in data due to sub cache line fault are different according to a physical location in DRAM, the present inventive concept may cause miscorrection of a first ECC to occur in a correctable region in a second ECC for each position.

When positions in which an adjacent 2-bit error occurs in data are different according to a physical location in DRAM, a memory device of the present inventive concept may design a first ECC capable of correcting SBE and the adjacent 2-bit error for each position. In an embodiment, the memory device may use different OD-ECC for each physical location. In another embodiment, the memory device may use the same OD-ECC in a plurality of positions, and data may be interleaved according to a physical location and may be input to the OD-ECC.

A memory system according to an embodiment of the present inventive concept may include a first ECC for correcting an error in a chip, and a second ECC for correcting an error on a DIMM level. In an embodiment, a memory device may correct a single bit error, may correct adjacent 2-bit errors occurring in an even WL, and may include an OD-ECC code and encoder/decoder in which miscorrection of an OD-ECC occurs in 2-DQ, when a sub cache line fault occurs in an even WL. In another embodiment, the memory device may correct a single bit error, may correct adjacent 2-bit errors occurring in an odd WL, and may include an OD-ECC code and encoder/decoder in which miscorrection of an OD-ECC occurs in 2-DQ, when a sub cache line fault occurs in an odd WL.

A memory device according to an embodiment of the present inventive concept may use a separate ECC encoder/decoder according to a physical location. In addition, a memory device according to an embodiment of the present inventive concept may permutate data of the encoder/decoder according to a physical location while using the same ECC encoder/decoder.

Although the present inventive concept uses a plurality of ECCs according to a physical location, only one ECC may be used for one piece of cache line data. And, although the present inventive concept uses a plurality of ECCs, the present inventive concept may be configured to have the same correction capability. In order for the ECC to have the same correction capability for each DRAM position, a memory device may use an OD-ECC according to error characteristics of a physical location.

A memory device, a memory system including the same, and an operating method thereof according to an embodiment of the present inventive concept may improve data reliability by performing on-die error correction differently according to a physical location.

While example embodiments have been illustrated and described above, it will be apparent to those skilled in the art that modifications and variations could be made without departing from the scope of the present inventive concept as defined by the appended claims.

What is claimed is:

1. A memory device, comprising:
a memory cell array including memory cells arranged into a plurality of regions; and
an error correction code (ECC) circuit configured to perform error correction on data read from the plurality of regions,
wherein, when one or more miscorrections occur due to a sub-cache line fault in one of the plurality of regions, the ECC circuit is configured such that the one or more miscorrections are arranged into the one of the plurality of regions.

2. The memory device of claim 1, wherein each of the plurality of regions includes a plurality of DQs.

3. The memory device of claim 2, wherein the ECC circuit is configured such that the one or more miscorrections are arranged into one of the plurality of DQs included in the one of the plurality of regions.

4. The memory device of claim 2, wherein the ECC circuit is configured such that the one or more miscorrections are arranged into two of the plurality of DQs included in the one of the plurality of regions.

5. The memory device of claim 1, wherein the ECC circuit is configured to correct a single bit error and adjacent 2-bit errors in the memory cells.

6. The memory device of claim 1, wherein the one or more miscorrections are an erroneous correction by the ECC circuit and occur in the ECC circuit when an error exceeds correction capability of the ECC circuit.

7. The memory device of claim 6, wherein the correction capability of the ECC circuit is determined based on error characteristics of each of the memory cells.

8. The memory device of claim 2, wherein a size of each of the plurality of DQs is a predetermined number of bits.

9. The memory device of claim 8, wherein the predetermined number of bits is 16 bits.

10. The memory device of claim 1, wherein the one or more miscorrections in the one of the plurality of regions is corrected by a second ECC circuit of a memory controller outside the memory device.

11. A memory system, comprising:
a memory controller comprising a first error correction code (ECC) circuit configured to perform error correction; and
a memory device connected to the memory controller, and comprising:
a memory cell array including memory cells arranged into a plurality of regions; and a second ECC circuit configured to perform error correction on data read from the plurality of regions, wherein, when one or more miscorrections occur due to a sub-cache line fault in one of the plurality of regions, the second ECC circuit is configured such that the one or more miscorrections are arranged into the one of the plurality of regions.

12. The memory system of claim 11, wherein each of the plurality of regions includes a plurality of DQs.

13. The memory system of claim 12, wherein the second ECC circuit is configured such that the one or more miscorrections are arranged into one of the plurality of DQs in the one of the plurality of regions.

14. The memory system of claim 12, wherein the second ECC circuit is configured such that the one or more miscorrections are arranged into two of the plurality of DQs in the one of the plurality of regions.

15. The memory system of claim 11, wherein the second ECC circuit is configured to correct a single bit error and adjacent 2-bit errors in the memory cells.

16. The memory system of claim 11, wherein the one or more miscorrections are an erroneous correction by the second ECC circuit and occurs in the second ECC circuit when an error exceeds correction capability of the second ECC circuit.

17. The memory system of claim 16, wherein the correction capability of the second ECC circuit is determined based on error characteristics of each of the memory cells.

18. The memory system of claim 12, wherein a size of each of the plurality of DQs is a predetermined number of bits.

19. The memory system of claim 18, wherein the predetermined number of bits is 16 bits.

20. The memory system of claim 11, wherein the one or more miscorrections in the one of the plurality of regions is corrected by the first ECC circuit of the memory controller.

* * * * *